(12) United States Patent
Sadd et al.

(10) Patent No.: US 7,692,972 B1
(45) Date of Patent: Apr. 6, 2010

(54) SPLIT GATE MEMORY CELL FOR PROGRAMMABLE CIRCUIT DEVICE

(75) Inventors: Michael Sadd, Austin, TX (US); Fethi Dhaoui, Patterson, CA (US); George Wang, Sunnyvale, CA (US); John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 148 days.

(21) Appl. No.: 12/177,680

(22) Filed: Jul. 22, 2008

(51) Int. Cl.
G11C 16/04 (2006.01)
(52) U.S. Cl. .................... 365/185.26; 365/189.11; 365/185.01; 365/104
(58) Field of Classification Search ............ 365/185.26, 365/189.11, 185.01, 104
See application file for complete search history.

(56) References Cited

U.S. PATENT DOCUMENTS

| | | | |
|---|---|---|---|
| 4,375,086 A | 2/1983 | van Velthoven |
| 5,012,315 A | 4/1991 | Shur |
| 5,026,657 A | 6/1991 | Lee et al. |
| 5,040,036 A | 8/1991 | Hazani |
| 5,079,620 A | 1/1992 | Shur |
| 5,162,247 A | 11/1992 | Hazani |
| 5,242,848 A | 9/1993 | Yeh |
| 5,482,871 A | 1/1996 | Pollack |
| 5,528,056 A | 6/1996 | Shimada et al. |
| 5,608,243 A | 3/1997 | Chi et al. |
| 5,691,937 A | 11/1997 | Ohta |
| 5,808,317 A | 9/1998 | Kuo |
| 5,936,883 A | 8/1999 | Kurooka et al. |
| 5,939,749 A | 8/1999 | Taketa et al. |
| 6,063,670 A | 5/2000 | Lin et al. |
| 6,074,914 A | 6/2000 | Ogura |
| 6,118,157 A | 9/2000 | Bergemont |
| 6,136,652 A | 10/2000 | Hazani |
| 6,177,318 B1 | 1/2001 | Ogura et al. |
| 6,323,085 B1 | 11/2001 | Sandhu et al. |
| 6,387,757 B1 | 5/2002 | Chu et al. |
| 6,420,233 B1 | 7/2002 | Hsieh et al. |
| 6,465,836 B2 | 10/2002 | Lin et al. |
| 6,468,863 B2 | 10/2002 | Hsieh et al. |
| 6,482,700 B2 | 11/2002 | Chen et al. |
| 6,518,123 B2 | 2/2003 | Lin |
| 6,614,072 B2 | 9/2003 | Sandhu et al. |
| 6,656,796 B2 | 12/2003 | Chan et al. |
| 6,697,281 B2 | 2/2004 | Hoang |
| 6,756,629 B1 | 6/2004 | Furuhata |

(Continued)

*Primary Examiner*—Thong Q Le
(74) *Attorney, Agent, or Firm*—Lewis and Roca LLP

(57) ABSTRACT

A split-gate memory cell, includes an n-channel split-gate non-volatile memory transistor having a source, a drain, a select gate over a thin oxide, and a control gate over a non-volatile gate material and separated from the select gate by a gap. A p-channel pull-up transistor has a drain coupled to the drain of the split-gate non-volatile memory transistor, a source coupled to a bit line, and a gate. A switch transistor has first and second source/drain diffusions, and a gate coupled to the drains of the split-gate non-volatile memory transistor and the p-channel pull-up transistor. An inverter has an input coupled to the second source/drain diffusion of the switch transistor, and an output. A p-channel level-restoring transistor has a source coupled to a supply potential, a drain coupled to the first source/drain diffusion of the switch transistor and a gate coupled to the output of the inverter.

12 Claims, 2 Drawing Sheets

U.S. PATENT DOCUMENTS

| | | |
|---|---|---|
| 6,842,370 B2 | 1/2005 | Forbes |
| 6,853,587 B2 | 2/2005 | Forbes |
| 6,933,198 B2 | 8/2005 | Chu et al. |
| 6,979,623 B2 | 12/2005 | Rotondaro et al. |
| 7,054,194 B2 | 5/2006 | Liaw et al. |
| 7,072,217 B2 | 7/2006 | Prall |
| 7,112,490 B1 | 9/2006 | Hong et al. |
| 7,169,668 B2 | 1/2007 | Yang et al. |
| 7,205,608 B2 | 4/2007 | Chindalore et al. |
| 7,211,487 B2 | 5/2007 | Chindalore et al. |
| 7,211,858 B2 | 5/2007 | Prinz |
| 7,226,840 B2 | 6/2007 | Chindalore et al. |
| 7,230,305 B2 | 6/2007 | Min et al. |
| 7,250,340 B2 | 7/2007 | Swift et al. |
| 7,256,454 B2 | 8/2007 | Yater et al. |
| 7,262,997 B2 | 8/2007 | Yater et al. |
| 7,269,063 B2 | 9/2007 | Chih |
| 7,285,819 B2 | 10/2007 | Chindalore et al. |
| 7,314,798 B2 | 1/2008 | Chindalore et al. |
| 7,315,474 B2 | 1/2008 | Lue |
| 7,391,653 B2 | 6/2008 | Ogura et al. |
| 7,394,686 B2 | 7/2008 | Swift et al. |
| 2004/0080012 A1 | 4/2004 | Kim |
| 2005/0003614 A1 | 1/2005 | Min et al. |
| 2005/0141266 A1 | 6/2005 | Jung |
| 2005/0162928 A1 | 7/2005 | Rosmeulen |
| 2006/0154424 A1 | 7/2006 | Yang et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202261 A1 | 9/2006 | Lue et al. |
| 2007/0086240 A1 | 4/2007 | Kern et al. |
| 2007/0086241 A1 | 4/2007 | Kern et al. |
| 2007/0267687 A1 | 11/2007 | Lue |
| 2007/0268753 A1 | 11/2007 | Lue et al. |
| 2008/0019173 A1* | 1/2008 | Li .................. 365/185.02 |
| 2008/0076221 A1 | 3/2008 | Kang et al. |

* cited by examiner

SPLIT GATE MEMORY CELL FOR PROGRAMMABLE CIRCUIT DEVICE

BACKGROUND OF THE INVENTION

1. Field of the Invention

The present invention relates to memory cells and especially to memory cells employed in user-programmable integrated circuit devices such as field programmable gate array devices.

2. The Prior Art

Numerous prior memory cells have been proposed for controlling switching in user-programmable integrated circuits. Some prior schemes have employed n-channel nano-crystal or SONOS transistors as pull-down devices and used volatile p-channel transistors as pull-up devices. Other schemes have employed p-channel nano-crystal or SONOS transistors and used volatile re-channel transistors as pull-down devices. Still other schemes have used both re-channel and p-channel nano-crystal or SONOS transistors as pull-down and pull-up devices, respectively, to form push-pull memory cells.

One example of a prior-art device is shown in United states Patent Publication No. 2005/0141266, now abandoned. Another such example is shown in United States Patent Publication No. 2008/0076221.

One of the disadvantages that prior-art solutions are subject to results from the fact that the voltages that are necessary to program and erase the memory devices are significantly higher than the voltages encountered by the devices during normal circuit operation. Because of the presence of these higher voltages during programming and erasing of the memory cells, the other transistor devices associated with the memory cells have to be fabricated to withstand these higher voltages.

BRIEF DESCRIPTION

According to a first aspect of the present invention, a split-gate push-leak memory cell has reduced stand-by leakage, low on-state switch impedance, a compact cell size, low-voltage operation on the bit-line, and low-current, fast HCI programming. A split-gate non-volatile memory (e.g., nano-crystal or SONOS) device forms a compact two-transistor cell with a select gate over a thin oxide portion, and a control gate over a nano-crystal/SONOS stack, and a gap between the two gates. The diffusion closest to the nano-crystal/SONOS layer is a source that may be shared with another adjoining memory cell. The diffusion closest to the thin oxide select gate portion of the split-gate cell is connected to a gate of a thin-oxide switch transistor and a thin-oxide p-channel pull-up transistor connected to a bit line. The switch device drives an output buffer that includes a p-channel transistor providing feedback to the buffer to restore a full logic level.

According to another aspect of the present invention, a split-gate nano-crystal or SONOS device forms a memory cell with a select gate over a thin oxide portion, and at least one control gate over a nano-crystal/SONOS stack, and a gap between the two gates. The diffusion closest to the nano-crystal/SONOS layer is a source that may be shared with another adjoining memory cell. The diffusion closest to the thin oxide select gate portion of the split-gate cell connected to a gate of a thin-oxide switch transistor. A programmable p-channel storage transistor that may be a pmos version of the split-gate device is connected to the bit-line. The addition of the p-channel pull-up transistor that is erased and programmed in tandem with the n-channel storage transistor creates a CMOS inverter with redundant storage.

According to another aspect of the present invention, two split-gate nano-crystal or SONOS devices each form a memory cell with a select gate over a thin oxide portion, and at least one control gate over a nano-crystal/SONOS stack, and a gap between the two gates. The split-gate cells each form the lower legs of a level-shifting arrangement, the mid-term node is cross coupled to the p-channel transistors. A switch transistor or full transmission gate is driven by the output of the latch. One cell remains erased and the other cell is programmed following programming and erasing mechanism as previously disclosed. The cell latches a one or zero alternatively in each leg depending on which side is programmed, turning on or off the switch transistor or transmission gate.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

One of the disadvantages that prior-art solutions are subject to results from the fact that the voltages that are necessary to program and erase the memory devices are significantly higher than the voltages encountered by the devices during normal circuit operation. Because of the presence of these higher voltages during programming and erasing of the memory cells, the other transistor devices associated with the memory cells have to be fabricated to withstand these higher voltages.

Figure 1:
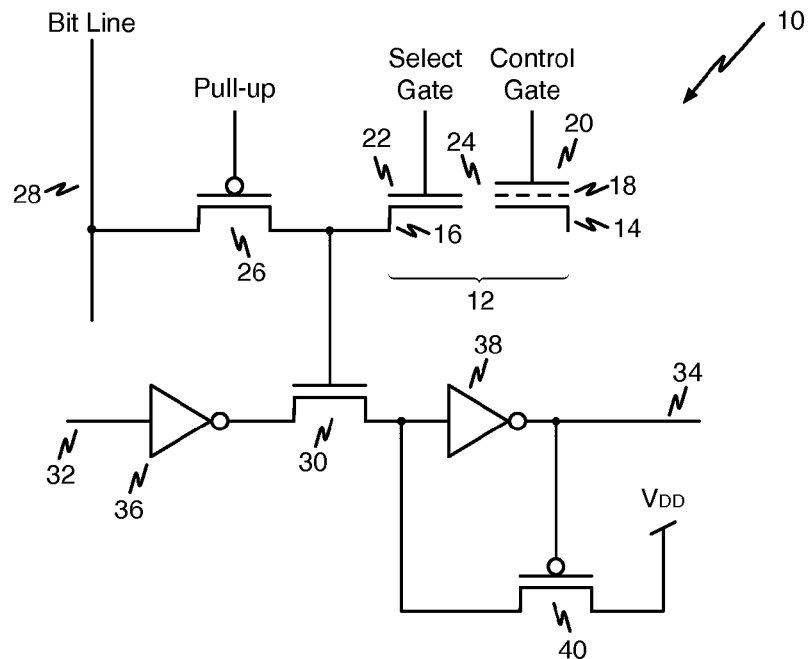
FIG. 1 is a schematic diagram of an illustrative memory cell according to one aspect of the present invention.

Referring first to FIG. 1, an illustrative split-gate memory cell 10 according to a first aspect of the present invention is shown. Memory cell 10 includes a split-gate non-volatile memory transistor shown at reference numeral 12. Split-gate non-volatile memory transistor 12 includes a source 14 and a drain 16. A floating gate (such as flash) or other charge retention structure shown at reference numeral 18, such as SONOS or nano-crystal material as is known in the art, is disposed towards the source 12 of split-gate non-volatile memory transistor 12. A control gate 20 overlies and is insulated from floating gate 18. A select gate 22 is disposed towards the drain side 16 of split-gate non-volatile memory transistor 12. The control gate 20 and select gate 22 are separated by a gap 24 as is known in the art.

The drain of split-gate non-volatile memory transistor 12 is coupled to the drain of a p-channel pull-up transistor 26. The source of p-channel pull-up transistor 26 is coupled to a bit line 28. The gate of p-channel pull-up transistor 26 is coupled to a pull-up gate line.

The split-gate non-volatile memory transistor 12 controls a low-voltage (i.e., thin oxide) n-channel switch transistor 30 used to selectively pass a signal between an input node 32 and an output node 34. N-channel switch transistor 30 is preferably a low-voltage device. Input node 32 drives inverter 36. If n-channel switch transistor 30 is turned on, the output of inverter 36 passes through n-channel switch transistor 30 and drives inverter 38. Inverter 38 drives output node 34. P-channel level-restoring transistor 40 has its source coupled to $V_{DD}$, its drain coupled to the input of inverter 38, and its gate coupled to the output of inverter 38.

Table 1 shows exemplary operating conditions for a memory cell 10 according to the present invention during programming operations, erase operations, and normal operating conditions. Actual voltages may vary depending on the geometry and process used in any particular implementation of the circuits of the present invention.

TABLE 1

|  | Bitline | Select Gate | Control Gate | Source | Pull-up Gate |
|---|---|---|---|---|---|
| Program | 0-0.4 V (Selected) | 13 V (Selected) | 13 V | 6 V | 0 V |
|  | 1.2 V (Unselected) | 0 V (Unselected) |  |  |  |
| Erase | 0 V | 1.2 V | 15 V | 0 V | 0 V |
| Operating | 1.2 V | 0.5 V-1.2 V | ~1.2 V | 0 V | 0.8 V-1.1 V |

If split-gate non-volatile memory transistor 12 is turned on, the common drain connection of split-gate non-volatile memory transistor 12 and p-channel pull-up transistor 26 is pulled down to ground, forcing n-channel switch transistor 30 to be turned off. If split-gate non-volatile memory transistor 12 is turned off, the common drain connection of split-gate non-volatile memory transistor 12 and p-channel pull-up transistor 26 is maintained at a high level through p-channel pull-up transistor 26 which is weakly turned on during normal operation of the circuit containing memory cell 10 and is thus operating as a "leaker."

Because p-channel pull-up transistor 26 is only weakly turned on during normal circuit operation, p-channel level-restoring transistor 40 assures that the high logic level of the circuit is maintained at full value. When a logic low level is presented to n-channel switch transistor 30 from the output of inverter 36, the input of inverter 38 is pulled to ground. The output of inverter 38 is driven high, and p-channel level-restoring transistor 40 is turned off. When a logic high level is presented to n-channel switch transistor 30 from the output of inverter 36, the input of inverter 38 is high but is not driven strongly through n-channel switch transistor 30. The output of inverter 38 is driven high, and p-channel level-restoring transistor 40 is turned on, providing the full $V_{DD}$ potential (minus a threshold voltage) to the input of inverter 38.

The memory cell of FIG. 1 exhibits a low on-state switch impedance (e.g., in the order of 1,000 ohms because a low-voltage switch device having a strong drive current is used. The cell size is compact, and allows low-voltage operation on the bit-line and low-current, fast hot-carrier-injection (HCI) programming.

Because of the split-gate arrangement, transistors 26, 30, and 40 may be fabricated using low-voltage design rules and geometries (e.g., oxide thicknesses). Because the voltage at the bitline 28 never exceeds the low-voltage $V_{DD}$, the switch, select-gate, and pull-up devices (transistors 26, 30, and 40) may all be constructed with thin gate oxides. These devices may be constructed in the same region as the n-channel split-gate non-volatile memory transistor 12, or since they employ thin gate oxides, some may be moved outside the region to a low-voltage oxide area. The switch device may therefore pass a logic level, with the aid of the level-restore circuit, with low output impedance and without a gate over-stress condition. In addition, the select gate 22 may also be separated from drain side of n-channel split-gate non-volatile memory transistor 12 using low-voltage oxide thicknesses. The higher voltages (13V and 15V) used during programming and erasing of n-channel split-gate non-volatile memory transistor 12 only appear on control gate 20 (column 4 of TABLE 1), and thus this is the only portion of the memory cell device 10 that needs to be fabricated using techniques and geometries that will allow operation at these higher voltages. In addition, the select gate of the split-gate cell provides an extra degree of control to reduce leakage fluctuation compared to a 3-transistor push/leak cell.

Figure 2:
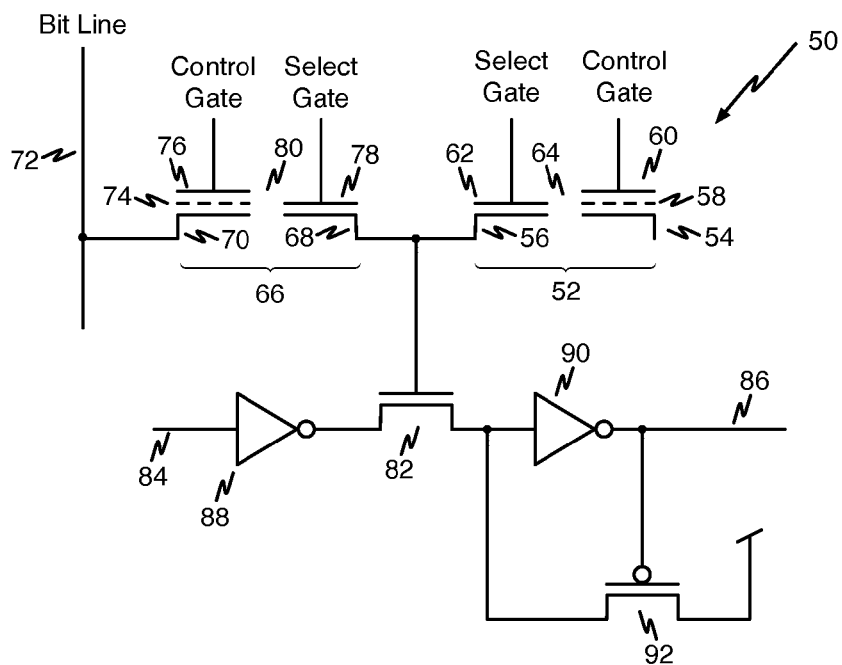
FIG. 2 is a schematic diagram of an illustrative memory cell according to another aspect of the present invention.

Referring now to FIG. 2 an illustrative split-gate memory cell 50 according to another aspect of the present invention is shown. Memory cell 50 includes a split-gate non-volatile memory transistor shown at reference numeral 52. Split-gate non-volatile memory transistor 52 includes a source 54 and a drain 56. A floating gate (such as flash) or other charge retention structure shown at reference numeral 58, such as SONOS or nano-crystal material as is known in the art, is disposed towards the source 52 of split-gate non-volatile memory transistor 52. A control gate 60 overlies and is insulated from floating gate 58. A select gate 62 is disposed towards the drain side 56 of split-gate non-volatile memory transistor 52. The control gate 60 and select gate 62 are separated by a gap 64 as is known in the art.

Unlike the embodiment shown in FIG. 1, the illustrative embodiment shown in FIG. 2 does not employ a volatile pull-up transistor but instead employs a p-channel split-gate non-volatile memory transistor 66. The drain of n-channel split-gate non-volatile memory transistor 52 is coupled to the drain 68 of p-channel split-gate p-channel pull-up transistor 66. The source 70 of p-channel split-gate non-volatile memory transistor 62 is coupled to a bit line 72. A floating gate (such as flash) or other charge retention structure shown at reference numeral 74, such as SONOS or nano-crystal material as is known in the art, is disposed towards the source 70 of p-channel split-gate non-volatile memory transistor 66. A control gate 76 overlies and is insulated from floating gate 74. A select gate 78 is disposed towards the drain side 68 of p-channel split-gate non-volatile memory transistor 66. The control gate 76 and select gate 78 are separated by a gap 80 as is known in the art.

Table 2 shows exemplary operating conditions for a memory cell 50 according to the present invention during programming operations, erase operations, and normal operating conditions. Actual voltages may vary depending on the geometry and process used in any particular implementation of the circuits of the present invention.

TABLE 2

|  | N-Channel Bitline | Select Gate | Control Gate | P-Channnel Control Gate | P-Channel Select Gate | P-Channel Bitline |
|---|---|---|---|---|---|---|
| Program Select | 0-0.4 V | 13 V | 13 V | 0 V | 0 V | 6 V |
| Program Unselect | 1.2 V | 0 V | 13 V | 0 V | 13 V | 6 V |
| Erase | 0 | 1.2 V | 15 V | 15 V | 0 V | 0 V |
| Operating | Ground | 1.2 V | ~1.2 V | ~1.2 V | Ground | 1.2 V |

The n-channel split-gate non-volatile memory transistor 52 and p-channel split-gate non-volatile memory transistor 66 together control an n-channel switch transistor 82 used to selectively pass a signal between an input node 84 and an output node 86. Input node 84 drives inverter 88. If n-channel switch transistor 82 is turned on, the output of inverter 88 passes through n-channel switch transistor 82 and drives inverter 90. Inverter 90 drives output node 86. P-channel level-restoring transistor 92 has its source coupled to $V_{DD}$, its drain coupled to the input of inverter 90, and its gate coupled to the output of inverter 90.

Figure 3:
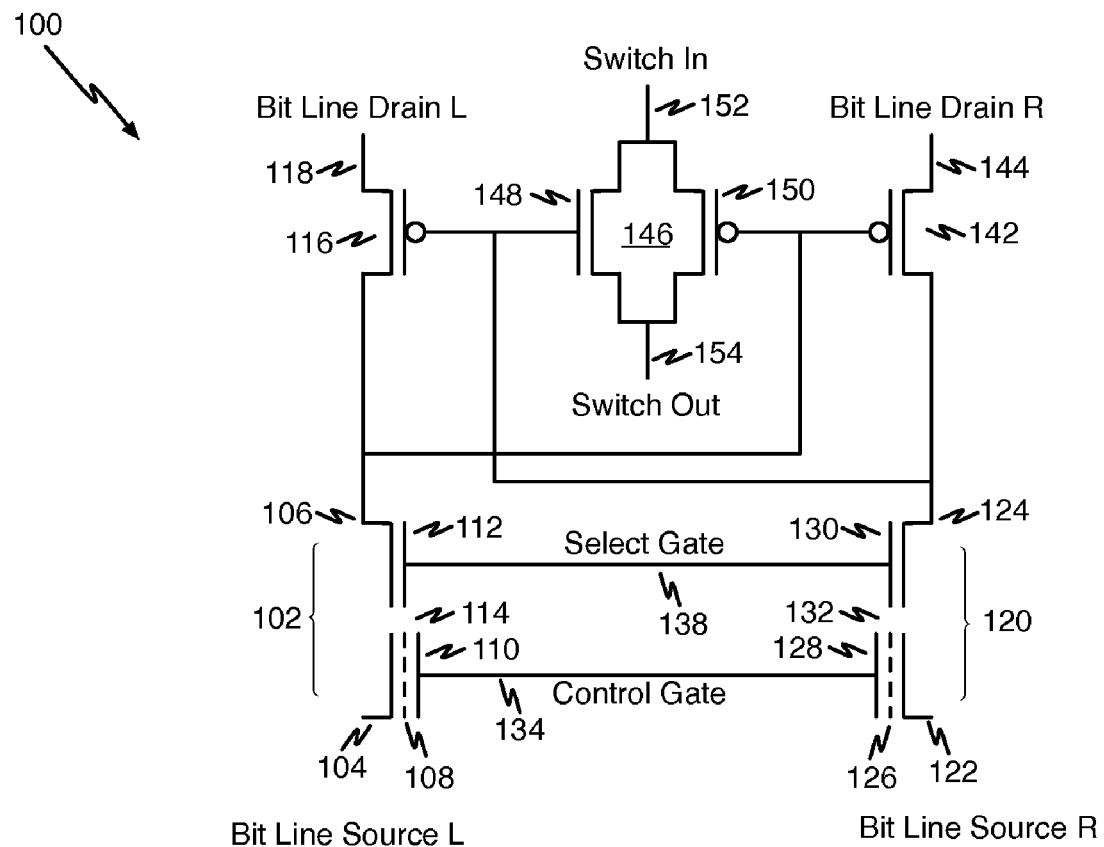
FIG. 3 is a schematic diagram of an illustrative memory cell according to another aspect of the present invention.

Referring now to FIG. 3, a split-gate memory cell 100 according to another aspect of the present invention is shown. Memory cell 100 includes a left n-channel split-gate non-volatile memory transistor shown at reference numeral 102. Left n-channel split-gate non-volatile memory transistor 102 includes a source 104 and a drain 106. A floating gate (such as flash) or other charge retention structure shown at reference numeral 108, such as SONOS or nano-crystal material as is known in the art, is disposed towards the source 102 of split-gate non-volatile memory transistor 102. A control gate 110 overlies and is insulated from floating gate 108. A select gate 112 is disposed towards the drain side 108 of split-gate non-volatile memory transistor 102. The control gate 110 and select gate 112 are separated by a gap 114.

A left p-channel pull-up transistor 118 has its drain coupled to the drain of right n-channel split-gate non-volatile memory transistor 116. The source of left p-channel pull-up transistor 118 is coupled to a left bit line 118.

Memory cell 100 also includes a right n-channel split-gate non-volatile memory transistor shown at reference numeral 120. Right n-channel split-gate non-volatile memory transistor 120 is essentially the same as left n-channel split-gate non-volatile memory transistor 102 and includes a source 122 and a drain 124. A floating gate (such as flash) or other charge retention structure shown at reference numeral 126, such as SONOS or nano-crystal material as is known in the art, is disposed towards the source 122 of right n-channel split-gate non-volatile memory transistor 120. A control gate 128 overlies and is insulated from floating gate 126. A select gate 130 is disposed towards the drain side 124 of right n-channel split-gate non-volatile memory transistor 120. The control gate 128 and select gate 130 are separated by a gap 132. The control gates 110 and 128 of left and right n-channel split-gate non-volatile memory transistors 102 and 120 are coupled together by line 134. The select gates 112 and 130 of left and right re-channel split-gate non-volatile memory transistors 102 and 120 are coupled together by line 140.

A right p-channel pull-up transistor 142 has its drain coupled to the drain of right n-channel split-gate non-volatile memory transistor 120. The source of right p-channel pull-up transistor 142 is coupled to a left bit line 144.

A Pass (transmission) gate 146 is formed from an n-channel pass-gate transistor 148 and a p-channel pass-gate transistor 150 connected in parallel between a switch input node 152 and a switch output node 154. The gate of re-channel pass-gate transistor 148 is coupled to the drains of right n-channel split-gate non-volatile memory transistor 120 and right p-channel pull-up transistor 142. The gate of p-channel pass-gate transistor 150 is coupled to the drains of left re-channel split-gate non-volatile memory transistor 102 and left p-channel pull-up transistor 118. Persons of ordinary skill in the art will observe that these connections could be reversed, in which case the pass gate would be turned on by reversing the programmed and erased states of left and right n-channel split-gate non-volatile memory transistors 102 and 120.

In the memory cell 100 of FIG. 3, one of left and right n-channel split-gate non-volatile memory transistors 102 and 120 remains erased and the other is programmed following programming and erasing mechanism as previously disclosed. The cell latches a one or zero alternatively in each of the left or right leg depending on which side is programmed, turning on or off the switch transistor or transmission gate connected to the cell. While there are a number of transistors in the upper portion of the circuit, the use of low-voltage through p-channel devices may allow some to be moved into a thin oxide region. To reduce sensitivity upset, additional resistance may be provide on the feedback nodes.

The use of a select-gate to the nano-crystal/SONOS cell that may be biased in such a way as to reduce operational leakage and isolate thin oxide devices from programming voltages allows an erase operation to be performed by biasing the control gate alone, or by using an edge erase. This capability prevents erase voltages from damaging the low-voltage devices used in the circuit.

The memory cell of the present invention has several advantages when used in FPGA integrated circuits. The cell size is small. There are short interconnect lines between the memory and switch sides of the cell. In addition, the cells can be intermixed with logic.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A split-gate memory cell, including:
   an n-channel split-gate non-volatile memory transistor having a source and a drain, the source and drain defining a channel, a select gate over a portion of the channel nearest the drain, and a control gate over a non-volatile charge retention structure over a portion of the channel nearest the source, the select gate and the control gate separated by a gap;
   a p-channel pull-up transistor having a drain coupled to the drain of the split-gate non-volatile memory transistor, a source coupled to a bit line, and a gate;
   a switch transistor having a first source/drain diffusion, a second source/drain diffusion, and a gate coupled to the drains of the split-gate non-volatile memory transistor and the p-channel pull-up transistor;
   an inverting buffer having an input coupled to the second source/drain diffusion of the switch transistor, and an output;
   a p-channel level-restoring transistor having a source coupled to a supply potential, a drain coupled to the first source/drain diffusion of the switch transistor and a gate coupled to the output of the inverting buffer.

2. The split-gate memory cell of claim 1 wherein the non-volatile charge retention structure is a floating gate.

3. The split-gate memory cell of claim 1 wherein the non-volatile charge retention structure is a region of isolated nanocrystals.

4. The split-gate memory cell of claim 1 wherein the non-volatile charge retention structure is a SONOS structure.

5. A split-gate memory cell, including:
   an n-channel split-gate non-volatile memory transistor having a source and a drain, the source and drain defining a channel, a select gate over a portion of the channel nearest the drain, and a control gate over a non-volatile charge retention structure over a portion of the channel nearest the source, the select gate and the control gate separated by a gap;
   a p-channel split-gate non-volatile memory transistor having a drain coupled to the drain of the split-gate non-volatile memory transistor, a source coupled to a bit line, the source and drain defining a channel, a select gate over a portion of the channel nearest the drain, and a control gate over a non-volatile gate material over a portion of the channel nearest the source, the select gate and the control gate separated by a gap;
a switch transistor having a first source/drain diffusion, a second source/drain diffusion, and a gate coupled to the drains of the n-channel split-gate non-volatile memory transistor and the p-channel split-gate non-volatile memory transistor;
an inverting buffer having an input coupled to the second source/drain diffusion of the switch transistor, and an output;
a p-channel level-restoring transistor having a source coupled to a supply potential, a drain coupled to the first source/drain diffusion of the switch transistor and a gate coupled to the output of the inverting buffer.

6. The split-gate memory cell of claim 5 wherein the non-volatile charge retention structure is a floating gate.

7. The split-gate memory cell of claim 5 wherein the non-volatile charge retention structure is a region of isolated nanocrystals.

8. The split-gate memory cell of claim 5 wherein the non-volatile charge retention structure is a SONOS structure.

9. A split-gate memory cell, including:
a left n-channel split-gate non-volatile memory transistor having a source and a drain, the source and drain defining a channel, a select gate over a portion of the channel nearest the drain, and a control gate over a non-volatile charge retention structure over a portion of the channel nearest the source, the select gate and the control gate separated by a gap;
a right n-channel split-gate non-volatile memory transistor having a source and a drain, the source and drain defining a channel, a select gate over a portion of the channel nearest the drain, and a control gate over a non-volatile gate material over a portion of the channel nearest the source, the select gate and the control gate separated by a gap;
a left p-channel pull-up transistor having a drain coupled to the drain of the left n-channel split-gate non-volatile memory transistor, a source coupled to a left bit line, and a select gate coupled to the drain of the right n-channel split-gate non-volatile memory transistor;
a right p-channel pull-up transistor having a drain coupled to the drain of the right n-channel split-gate non-volatile memory transistor, a source coupled to a left bit line, and a select gate coupled to the drain of the left n-channel split-gate non-volatile memory transistor;
a pass gate including an n-channel pass-gate transistor connected in parallel with a p-channel pass-gate transistor between a switch input node and a switch output node, the n-channel pass-gate transistor having a gate coupled to the gate of a first one of the left and the right p-channel pull-up transistors, the p-channel pass-gate transistor having a gate coupled to the gate of a second one of the left and the right p-channel pull-up transistors.

10. The split-gate memory cell of claim 9 wherein the non-volatile charge retention structure is a floating gate.

11. The split-gate memory cell of claim 9 wherein the non-volatile charge retention structure is a region of isolated nanocrystals.

12. The split-gate memory cell of claim 9 wherein the non-volatile charge retention structure is a SONOS structure.

* * * * *